(12) United States Patent
Ahn et al.

(10) Patent No.: US 12,169,212 B2
(45) Date of Patent: Dec. 17, 2024

(54) PROBE HEAD AND PROBE CARD COMPRISING SAME

(71) Applicant: POINT ENGINEERING CO., LTD., Chungcheongnam-do (KR)

(72) Inventors: Bum Mo Ahn, Gyeonggi-do (KR); Sung Hyun Byun, Gyeonggi-do (KR); Dong Hyeok Seo, Chungcheongnam-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/912,518

(22) PCT Filed: Mar. 23, 2021

(86) PCT No.: PCT/KR2021/003564
§ 371 (c)(1),
(2) Date: Sep. 18, 2022

(87) PCT Pub. No.: WO2021/194213
PCT Pub. Date: Sep. 30, 2021

(65) Prior Publication Data
US 2023/0152350 A1 May 18, 2023

(30) Foreign Application Priority Data
Mar. 25, 2020 (KR) .................. 10-2020-0036448

(51) Int. Cl.
*G01R 1/073* (2006.01)
*G01R 31/28* (2006.01)

(52) U.S. Cl.
CPC ...... *G01R 1/07378* (2013.01); *G01R 1/07342* (2013.01); *G01R 31/2886* (2013.01)

(58) Field of Classification Search
CPC ............ G01R 1/07378; G01R 1/07342; G01R 31/2886; G01R 1/07357; G01R 1/07307
See application file for complete search history.

(56) References Cited

U.S. PATENT DOCUMENTS

| 4,983,908 A * | 1/1991 | Tada ................. G01R 1/07314 324/762.05 |
| 7,830,162 B2 * | 11/2010 | Lee .................... G01R 1/06744 324/754.09 |

(Continued)

FOREIGN PATENT DOCUMENTS

| JP | H03125448 | 5/1991 |
| JP | 2007171138 | 7/2007 |

(Continued)

OTHER PUBLICATIONS

"International Search Report (Form PCT/ISA/210) of PCT/KR2021/003564", mailed on Jul. 1, 2021, with English translation thereof, pp. 1-4.

(Continued)

*Primary Examiner* — G. M. A Hyder
(74) *Attorney, Agent, or Firm* — JCIPRNET

(57) ABSTRACT

Proposed are a probe head for testing, through a probe, a pattern formed on a wafer, and a probe card having the same. More particularly, proposed are a probe head in which formation of a guide hole into which a probe is inserted and insertion of the probe therein are facilitated, and a probe card having the same.

4 Claims, 6 Drawing Sheets

(56) References Cited

U.S. PATENT DOCUMENTS

| | | | |
|---|---|---|---|
| 2004/0070413 A1* | 4/2004 | Kasukabe | G01R 1/06744 |
| | | | 324/754.07 |
| 2013/0069686 A1* | 3/2013 | Wu | G01R 3/00 |
| | | | 29/829 |
| 2015/0198632 A1* | 7/2015 | Kim | G01R 1/07342 |
| | | | 324/750.25 |
| 2020/0271693 A1* | 8/2020 | Ahn | G01R 1/07371 |
| 2022/0149555 A1* | 5/2022 | Cho | G01R 1/07307 |

FOREIGN PATENT DOCUMENTS

| | | |
|---|---|---|
| KR | 1020090110992 | 10/2009 |
| KR | 1020100060973 | 6/2010 |
| KR | 2020100012965 | 12/2010 |
| KR | 1020120102341 | 9/2012 |
| KR | 101719912 | 3/2017 |
| TW | I314649 | 9/2009 |
| TW | 201531713 | 8/2015 |

OTHER PUBLICATIONS

"Office Action of Taiwan Counterpart Application", issued on May 15, 2024, with English translation thereof, pp. 1-10.
"Office Action of Korea Counterpart Application", issued on Oct. 25, 2024, with English translation thereof, p. 1-p. 12.

* cited by examiner

PROBE HEAD AND PROBE CARD COMPRISING SAME

TECHNICAL FIELD

The present disclosure relates generally to a probe head and a probe card having the same. More particularly, the present disclosure relates to a probe head for testing, through a probe, a pattern formed on a wafer, and a probe card having the same.

BACKGROUND ART

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which the pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided at the probe card to a wafer, and then sort defective semiconductor chips on the basis of feedback signals received thereby.

The probe card used for an electrical test of the semiconductor device may include a circuit board, an interposer, a space transformer, a probe head, and probes. In the probe card, an electrical path is provided through the circuit board, the interposer, the space transformer, and the probe head, and a pattern of a wafer is tested by the probes that directly contact the wafer.

The probe head supports the probes, and serves to prevent an electrical short due to contact between adjacent probes. Specifically, the probe head includes at least one guide plate, and the probes are provided and supported in guide holes formed in the guide plate.

An example of a patent that discloses a guide plate for a probe card is Korean Patent No. 10-1719912 (hereinafter, referred to as 'Patent document 1').

In Patent Document 1, a plurality of green sheets are stacked and pressed to form a green bar, and one surface of the green bar is irradiated with laser light to form through-holes into which probes are inserted.

In the case of a conventional ceramic guide plate made of a ceramic material, through-holes are mainly formed by a mechanical processing method using a drill or a laser.

However, there is a problem in that the through-holes formed using such mechanical processing are difficult to form with a fine size and pitch because mechanical errors have to be taken into account. With the recent trend toward miniaturization of semiconductor devices, the size and pitch of electrodes of the semiconductor device have become finer, and this has led to a demand for reducing the thickness of the probes of the probe card. Accordingly, there is a demand for making through-holes having the probes therein finer in size and pitch. However, it is difficult to meet such a demand with the ceramic guide plate due to the difficulty in realizing a fine size and pitch of the through-holes.

In addition, the ceramic guide plate has low transmittance, making it difficult to insert the probes.

This results in a problem in which the time and cost of manufacturing the probe card increase.

DOCUMENTS OF RELATED ART

Patent Documents (Patent Document 1) 1) Korean Patent No. 10-1719912

DISCLOSURE

Technical Problem

Accordingly, the present disclosure has been made keeping in mind the above problems occurring in the related art, and an objective of the present disclosure is to provide a probe head in which a plurality of guide holes of a fine size and pitch are simultaneously formed and a plurality of probes are easily inserted therein, and to provide a probe card having the same.

Technical Solution

In order to accomplish the above objective, according to one aspect of the present disclosure, there is provided a probe head for guiding a probe, the probe head including: a guide plate that has a guide hole into which the probe is inserted and is made of a photoresist capable of lithography.

Furthermore, the guide plate may have a light-transmitting property.

Furthermore, the guide plate may be configured such that the photoresist is subjected to heat treatment to have a hardness increased compared to before the heat treatment.

Furthermore, the photoresist of the guide plate may be an epoxy, polyimide, or acrylate-based photoresist.

Furthermore, the guide plate may be provided by stacking a plurality of photoresists capable of lithography.

According to another aspect of the present disclosure, there is provided a probe card including: a space transformer comprising a probe connection pad electrically connected to each of a plurality of probes; and a probe head provided below the space transformer, wherein the probe head may include a guide plate made of a photoresist capable of lithography.

Advantageous Effects

According to a probe head and a probe card having the same according to the present disclosure, it is possible to implement a fine size and pitch of holes into which a plurality of probes are inserted by providing a guide plate made of a photoresist, and to increase efficiency of the manufacturing process by forming the holes into which the probes are inserted simultaneously and rapidly.

In addition, it is possible to enable easy insertion of the probes due to the guide plate having a light-transmitting property, and to achieve high mechanical strength of a product itself due to excellent hardness of the guide plate.

MODE FOR INVENTION

Figure 1:
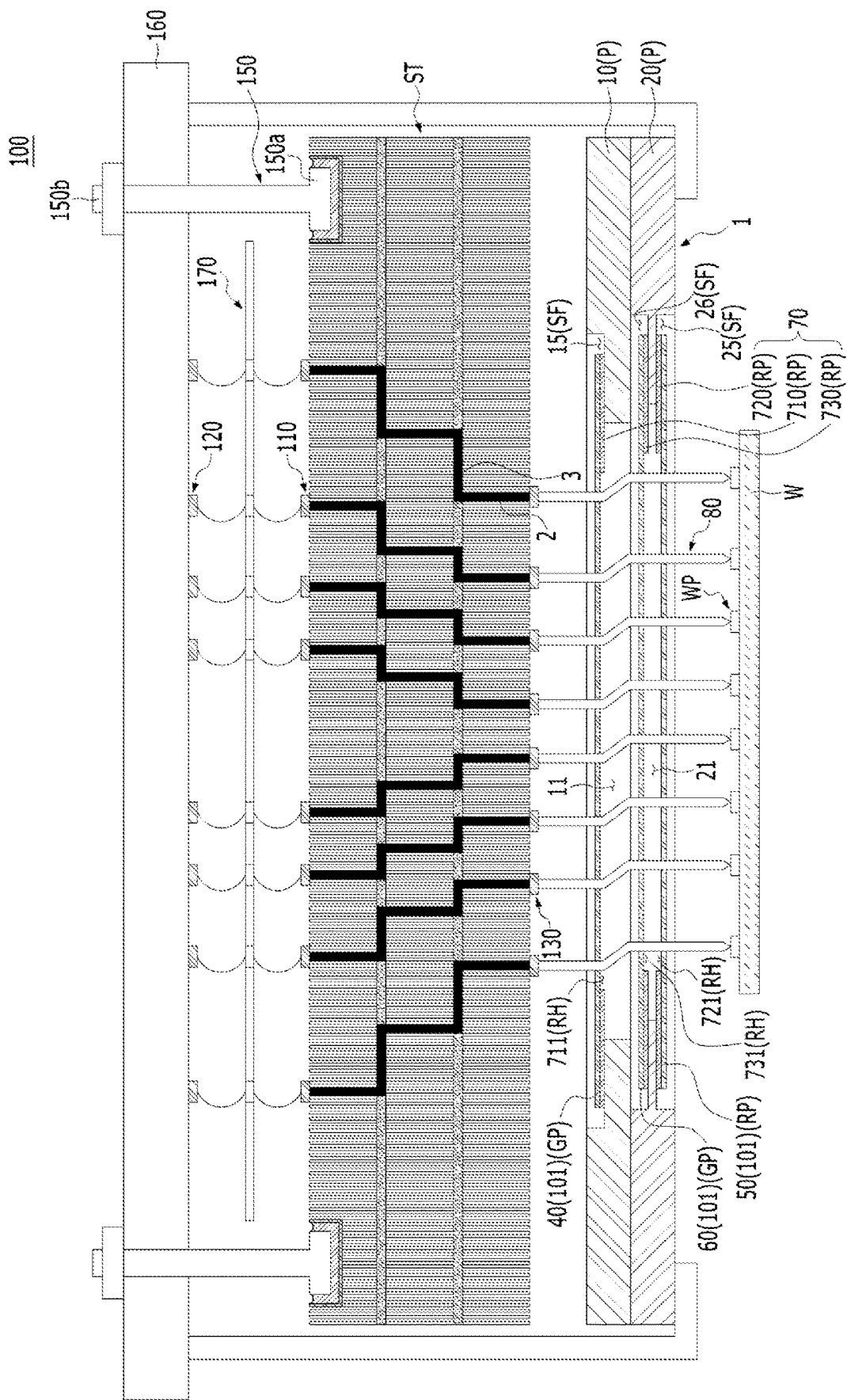
FIG. 1 is a view schematically illustrating a probe card having a probe head according to an exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the disclosure even though it is not clearly explained or illustrated in the description. Furthermore, in principle, all the conditional terms and embodiments listed in this description are clearly intended for the purpose of understanding the concept of the present disclosure, and one should understand that this disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, an exemplary embodiment of the present disclosure will be described in detail with reference to the accompanying drawings.

FIG. 1 is a view schematically illustrating a probe card 100 having a probe head 1 according to an exemplary embodiment of the present disclosure. In FIG. 1, for convenience of description, the number and size of a plurality of probes 80 are illustrated exaggeratedly.

Depending on the structure of installing the probes 80 on a space transformer ST and the structure of the probes 80, the types of the probe card 100 may be classified into a vertical type probe card, a cantilever type probe card, and a micro-electro-mechanical system (MEMS) probe card. In the present disclosure, as an example, a vertical type probe card 100 is illustrated to describe a coupling structure between the space transformer ST and other peripheral parts. The type of the probe card in which the coupling structure between the space transformer ST and other peripheral parts is implemented is not limited thereto, and the MEMS probe card and the cantilever type probe card may be used.

FIG. 1 illustrates a state in which an electrode pad WP of a wafer W is in contact with each of the probes 80 of the probe card 100 having the probe head 1 according to the exemplary embodiment of the present disclosure.

A test for electrical characteristics of semiconductor devices is performed by approaching the wafer W to the probe card 100 having the plurality of probes 80 on a wiring substrate, and bringing the respective probes 80 into contact with corresponding electrode pads WP on the wafer W. Specifically, the probes 80 may reach a position in contact with the electrode pads WP. Then, the wafer W may be further lifted to a predetermined height toward the probe card 100. This process is called overdrive.

As illustrated in FIG. 1, the probe card 100 having the probe head 1 according to the exemplary embodiment of the present disclosure may include: the space transformer ST including a vertical wiring part 2, a horizontal wiring part 3 connected to the vertical wiring part 2, and a probe connection pad 130 electrically connected to each of the plurality of probes 80; and a coupling member 150 having a first end 150a fixed to a surface of the space transformer ST and a second end 150b coupled to a circuit board 160 provided above the space transformer ST. In this case, the coupling member 150 may be configured as a bolt, but is not limited thereto.

As illustrated in FIG. 1, the circuit board 160 may be provided above the space transformer ST, and the probe head 1 having the plurality of probes 80 may be provided below the space transformer ST. In other words, the space transformer ST may be located between the circuit board 160 and the probe head 1. The space transformer ST may be coupled to peripheral parts by the coupling member 150. However, the structure in which the space transformer ST is coupled to the peripheral parts by the coupling member 150 is illustrated as an example, and thus is not limited thereto.

The space transformer ST coupled to the circuit board 160 by the coupling member 150 may be electrically connected thereto by an interposer 170 interposed between the circuit board 160 and the space transformer ST. Specifically, a first interposer connection pad 110 may be provided on an upper surface of the space transformer ST, and a second interposer connection pad 120 may be provided on a lower surface of the circuit board 160. Therefore, the interposer 170 interposed between the space transformer ST and the circuit board 160 may be joined to the first interposer connection pad 110 and the second interposer connection pad 120 to form an electrical connection between the space transformer ST and the circuit board 160.

The space transformer ST may be made of, for example, an anodic aluminum oxide film. The anodic aluminum oxide film refers to a film formed by anodizing a metal that is a base material, and pores refer to holes formed in the anodic aluminum oxide film during the process of forming the anodic aluminum oxide film by anodizing the metal. For example, in a case where the metal as the base material is aluminum (Al) or an aluminum alloy, the anodization of the base material forms the anodic aluminum oxide film consisting of anodized aluminum oxide ($Al_2O_3$) on a surface of the base material. The anodic aluminum oxide film thus formed includes a barrier layer in which no pores are formed and a porous layer in which pores are formed. The barrier layer is positioned on the base material, and the porous layer is positioned on the barrier layer. In a state in which the anodic aluminum oxide film having the barrier layer and the porous layer is formed on the surface of the base material, when the base material is removed, only the anodic aluminum oxide film consisting of anodized aluminum oxide ($Al_2O_3$) remains.

The anodic aluminum oxide film may have a coefficient of thermal expansion similar to that of the wafer W. Therefore, the anodic aluminum oxide film may be less likely to undergo thermal deformation due to heat under a high-temperature atmosphere. Therefore, the space transformer ST made of the anodic aluminum oxide film may have an advantage of being less likely to undergo thermal deformation under a high-temperature environment. The material of the space transformer ST is not limited thereto.

The space transformer ST may include the respective probe connection pads 130 electrically connected to the plurality of probes 80. The probes 80 provided at the probe head 2 provided below the space transformer ST may be brought into contact with the probe connection pads 130.

Specifically, the probe head 1 according to the exemplary embodiment of the present disclosure is provided below the space transformer ST. The probe head 1 according to the exemplary embodiment of the present disclosure may include a guide plate GP having a guide hole GH into which each of the plurality of probes 80 is inserted, and made of a photoresist 101 capable of lithography.

The probe head 1 according to the exemplary embodiment of the present disclosure having such a configuration may guide the probes 80. The probe head 1 according to the exemplary embodiment of the present disclosure may be manufactured by means of bolt fastening as an example. However, since this is a coupling means described as an example, the coupling means is omitted in FIG. 1.

The probe head 1 according to the exemplary embodiment of the present disclosure may have a structure in which a second plate 20 is provided under a first plate 10 to support the probes 80.

Specifically, a seating region SF in which the guide plate GP is provided may be formed in a plate P including the first plate 10 and the second plate 20.

The guide plate GP may include an upper guide plate 40, a lower guide plate 50, and an intermediate guide plate 60. The probe head 1 according to the exemplary embodiment of the present disclosure may include at least one of the upper guide plate 40, the lower guide plate 50, and the intermediate guide plate 60 that constitute the guide plate GP. As an example, the probe head 1 according to the exemplary embodiment of the present disclosure may include the upper and lower guide plates 40 and 50 and the intermediate guide plate 60.

The seating region SF in which the guide plate GP including these configurations is provided may be formed in each of the first and second plates 10 and 20. Specifically, an upper seating region 15 in which the upper guide plate 40 is provided may be formed in the first plate 10, and a lower seating region 25 in which the lower guide plate 50 is provided and an intermediate seating region 26 in which the intermediate guide plate 60 is provided may be formed in the second plate 20.

The probes 80 may sequentially pass through the upper guide plate 40, the lower guide plate 50, and the intermediate guide plate 60 to be provided toward the wafer W. Hereinafter, the configuration of the probe head 1 according to the exemplary embodiment of the present disclosure will be described in detail with reference to FIGS. 2 and 3.

Figure 2:
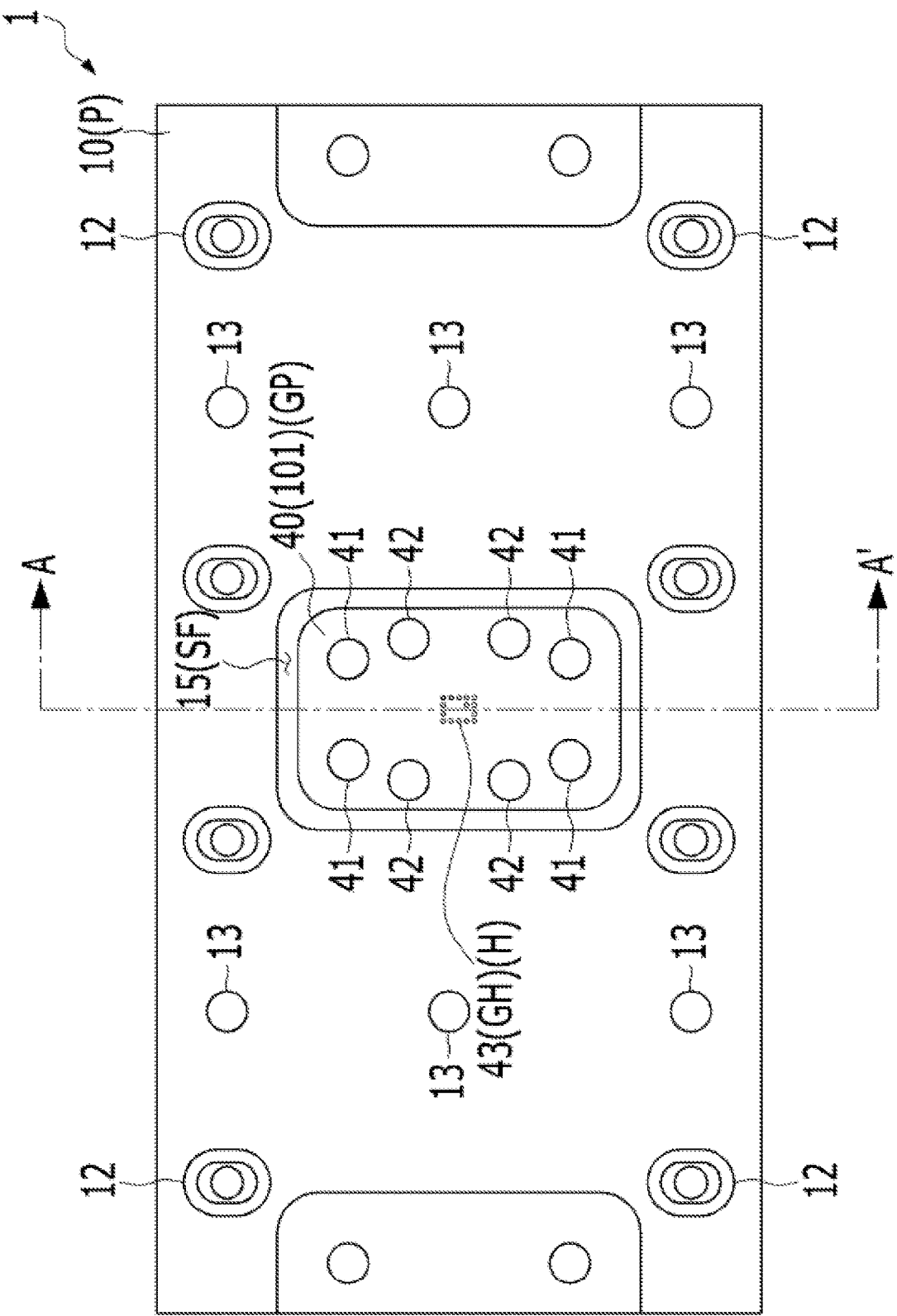
FIG. 2 is a top view illustrating the probe head according to the exemplary embodiment of the present disclosure.
Figure 3:
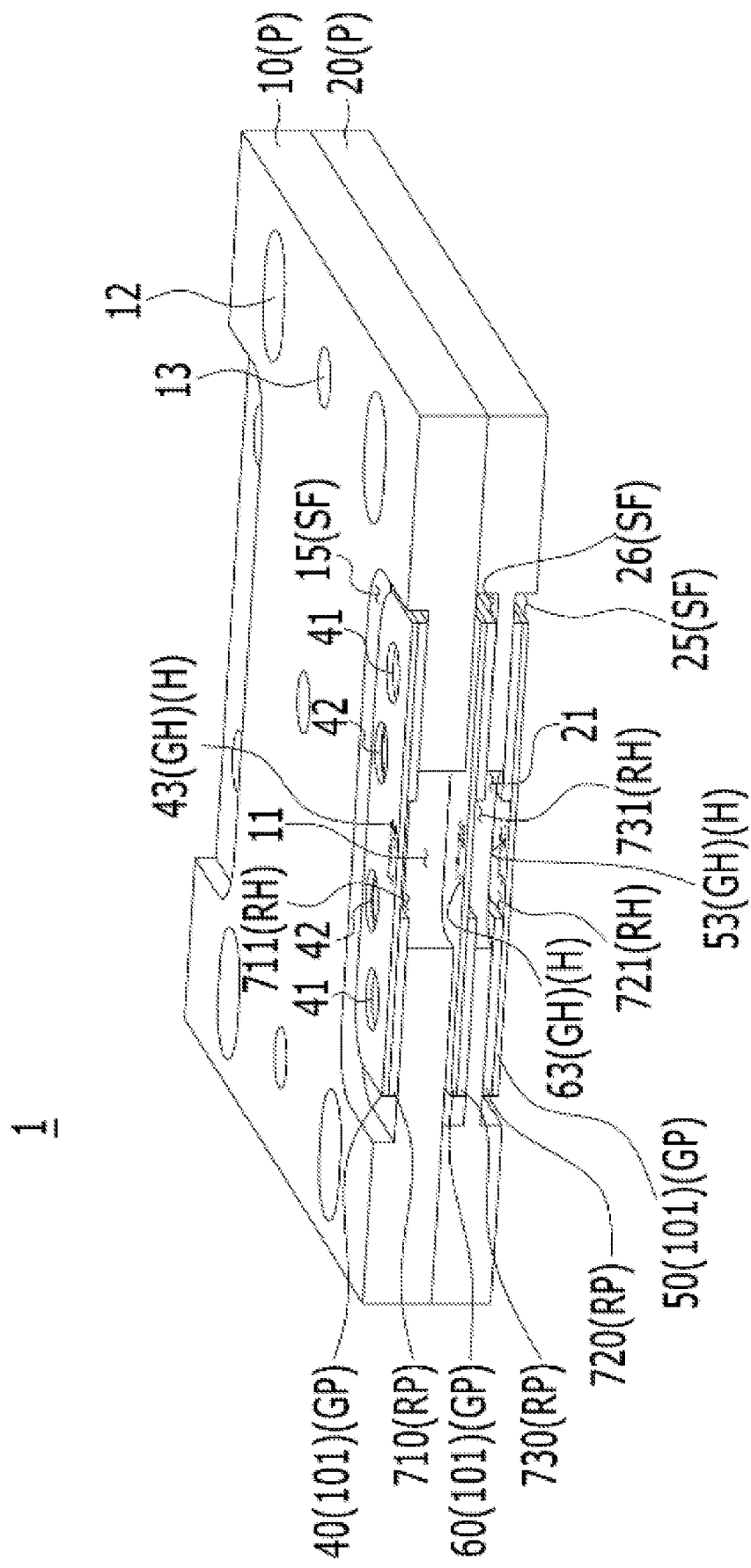
FIG. 3 is a perspective view when viewed from a surface cut along line A-A of FIG. 2.

FIG. 2 is a top view illustrating the probe head 1 according to the exemplary embodiment of the present disclosure. FIG. 3 is a perspective view when viewed from a surface cut along line A-A of FIG. 2.

As illustrated in FIGS. 2 and 3, the first plate 10 and the second plate 20 may be provided in corresponding shapes, and the second plate 20 may be provided under the first plate 10.

The first plate 10 may be provided with an upper coupling hole 12 and a first guide pin insertion hole 13. In addition, the second plate 20 may be provided with a lower coupling hole (not illustrated) and a second guide pin insertion hole (not illustrated) respectively corresponding to the sizes of the upper coupling hole 12 and the first guide pin insertion hole 13 at positions respectively corresponding to the upper coupling hole 12 and the first guide pin insertion hole 13.

A coupling means may be provided in each of the upper coupling hole 12 and the lower coupling hole. A guide pin may be provided in each of the first guide pin insertion hole 13 and the second guide pin insertion hole. In this case, the coupling means refers to a means for coupling the first plate 10 and the second plate 20. Meanwhile, the guide pin refers to an auxiliary means for aligning the first plate 10 and the second plate 20. The coupling means may be configured as a bolt as an example.

The process of coupling the first and second plates 10 and 20 using the guide pin and coupling means is as follows. Specifically, the guide pin may sequentially pass through the first guide pin insertion hole 13 and the second guide pin insertion hole to align the first plate 10 and the second plate 20, and then the coupling means may sequentially pass through the upper coupling hole 12 and the lower coupling hole to couple the first plate 10 and the second plate 20. In this case, the guide pin may be removed before the first and second plates 10 and 20 are coupled to each other by means of the bolt.

As illustrated in FIGS. 2 and 3, the positions, shapes, and numbers of the upper coupling hole 12 and the first guide pin insertion hole 13 of the first plate 10 are illustrated as an example, and thus are not limited thereto.

The upper seating region 15 is formed in the first plate 10, and the lower seating region 25 and the intermediate seating region 26 are formed in the second plate 20. In this case, the upper seating region 15 may be formed at an upper side of the first plate 10. The intermediate seating region 26 may be formed at an upper side of the second plate 20, and the lower seating region 25 may be formed at a lower side of the second plate 20.

In addition, the upper seating region 15, the lower seating region 25, and the intermediate seating region 26 may have the same size and shape.

After the first plate 10 and the second plate 20 are coupled to each other, the lower seating region 25 and the intermediate seating region 26 may be located on the same vertical line, but the upper seating region 15 may be located on a vertical line that is not the same as the vertical line on which the lower seating region 25 and the intermediate seating region 26 are located.

In addition, each of the first plate 10 and the second plate 20 may be provided with the guide plate 40. Specifically, the guide plate GP may be provided in each of the upper seating region 15, the lower seating region 25, and the intermediate seating region 26. Therefore, the guide plate GP may have a size smaller than that of the seating region SF.

The upper guide plate 40, the lower guide plate 50, and the intermediate guide plate 60 may be formed in shapes corresponding to each other, and may include the same configuration (e.g., the guide hole GH into which each of the plurality of probes 80 is inserted).

With this structure, handling of the probe head 1 according to the exemplary embodiment of the present disclosure may be facilitated. Specifically, when an end of a probe 80 first inserted through the guide hole GH is a front end of the probe 80, the upper guide plate 40, the lower guide plate 50, and the intermediate guide plate 60 may serve to guide front ends of the plurality of probes 80. That is, the guide plate GP, the lower guide plate 50, and the intermediate guide plate 60 may define a probing region of the probe card 100 having the probe head 1 according to the exemplary embodiment of the present disclosure. Therefore, on the entire area of the probe head 1 defined by the first plate 10 and the second plate 20, an area occupied by the upper guide plate 40, the lower guide plate 50, and the intermediate guide plate 60 may be the probing region.

Since the upper guide plate 40, the lower guide plate 50, and the intermediate guide plate 60 may have a smaller area than the first and second plates 10 and 20, a problem in which the probing region is broken or damaged may be minimized. Therefore, handling of the probe card 100 having the probe head 1 according to the exemplary embodiment of the present disclosure may be facilitated.

Unlike the probe head 1, when the guide plate GP defining the probing region defines the entire area of the probe head 1, an unnecessary area other than the probing region in which the plurality of probes 80 are provided and performing a practical probing process may be included in the probing region thereby constituting the entire area of the probe head 1.

In this structure, handling may be difficult because the probing region is damaged even if a portion of the probe head 1 is damaged.

However, in the case of the probe head 1 according to the exemplary embodiment of the present disclosure, since the guide plate GP defining the probing region has a smaller area than the first and second plates 10 and 20 defining the entire area of the probe head 1, the risk of damage may be lowered and ease of handling may be achieved.

In addition, in the case of the probe head 1 according to the exemplary embodiment of the present disclosure, since the guide plate GP has a smaller area than the plate P defining the entire area of the probe head 1, a relatively uniform flatness may be achieved compared to a structure in which the guide plate GP defines the entire area of the probe head 1.

Specifically, when the guide plate GP defines the entire area of the probe head 1, it is difficult to achieve uniform flatness due to a large area thereof. When the flatness of the upper guide plate 40, the lower guide plate 50, and the intermediate guide plate 60 each having the guide hole GH in which the probe 80 is provided is not uniform, the position of the probe 80 may be changed, resulting in an error in wafer pattern testing.

However, in the case of the probe head 1 according to the exemplary embodiment of the present disclosure, since the area of the upper guide plate 40, the lower guide plate 50, and the intermediate guide plate 60 each having the guide hole GH in which the probe 80 is provided is smaller than the entire area of the probe head 1, it may be advantageous to achieve uniform flatness.

As illustrated in FIGS. 2 and 3, the first plate 10 may serve to support, on an upper surface thereof, the upper guide plate 40 that serves to guide the front ends of the probes 80. The first plate 10 may have a larger area than the upper guide plate 40 and may support the upper guide plate 40 in at least a partial region of the upper surface thereof.

The upper seating region 15 in which the upper guide plate 40 is seated may be provided in the first plate 10. The upper seating region 15 may be configured as a concave recess in the upper surface of the first plate 10. However, the concave recess shape of the upper seating region 15 is illustrated as an example, and thus the shape thereof is not limited thereto. Therefore, the upper seating region 15 may be formed in a suitable shape to allow the upper guide plate 40 to be provided on the upper surface of the first plate 10 more stably.

The first plate 10 may include a first through-hole 11. Therefore, the first through-hole 11 may be formed at a position corresponding to a position where an upper guide hole 43 of the upper guide plate 40 is formed, to allow the plurality of probes 80 to be positioned therein, and in consideration of elastic deformation of the plurality of probes 80, may have an inner diameter capable of receiving the elastic deformation.

The second plate 20 may be coupled to a lower portion of the first plate 10. The second plate 20 may support, on a lower surface thereof, the lower guide plate 50 and the intermediate guide plate 60 that serve to guide the front ends of the probes 80. Specifically, the second plate 20 may support the intermediate guide plate 60 on an upper surface thereof and support the lower guide plate 50 on the lower surface thereof. In this case, the second plate 20 may have an area corresponding to the first plate 10. Therefore, the second plate 20 may support the intermediate guide plate 60 in at least a partial region of the upper surface thereof and may support the lower guide plate 50 in at least a partial region of the lower surface thereof.

The lower seating region 25 in which the lower guide plate 50 is seated may be provided in the lower surface of the second plate 20. In addition, the intermediate seating region 26 in which the intermediate guide plate 60 is seated may be provided in the upper surface of the second plate 20.

The lower seating region 25 and the intermediate seating region 26 may be configured as concave recesses in the upper and lower surfaces of the second plate 20, respectively. However, this is illustrated as an example, and thus the shapes of the lower seating region 25 and the intermediate seating region 26 are not limited thereto.

The lower seating region 25 and the intermediate seating region 26 may be provided at positions that are inverted from each other with respect to a center line of the second plate 20 horizontally disposed on a plane. Therefore, the lower guide plate 50 and the intermediate guide plate 60 may also be provided at positions that are inverted from each other with respect to the center line of the second plate 20 horizontally disposed on the plane. However, the inverted positions of the lower seating region 25 and the intermediate seating region 26 are illustrated as an example. Thus, the positions of the lower seating region 25 and the intermediate seating region 26 are not limited thereto.

The second plate 20 may include a second through-hole 21 corresponding to the first through-hole 11 of the first plate 10. Therefore, the probes 80 positioned in the first through-hole 11 may also be positioned in the second through-hole 21.

The second through-hole 21 may have the same inner diameter as the first through-hole 11. However, the sizes of the inner diameters of the first through-hole 11 and the second through-hole 21 is not limited. For example, the second through-hole 21 may be formed at a position corresponding to the first through-hole 11 and may have an inner diameter that is smaller than that of the first through-hole 11 and is capable of securing a free space that allows, when the plurality of probes 80 positioned in the first through-hole 11 are elastically deformed, the elastic deformation to be received therein. Alternatively, the second through-hole 21 may be formed at a position corresponding to the first through-hole 11 and may have an inner diameter larger than that of the first through-hole 11.

Specifically, the probe 80 may be inserted into the upper guide hole 43 of the upper guide plate 40, then inserted into an intermediate guide hole 63 of the intermediate guide plate 60, and finally inserted into a lower guide hole 53 of the lower guide plate 50 to protrude outward. With this, the probe head 1 according to the exemplary embodiment of the present disclosure may have a structure in which the plurality of probes 80 are positioned in the first through-hole 11 and the second through-hole 21.

At least one of the upper guide plate 40, the lower guide plate 50, and the intermediate guide plate 60 constituting the guide plate GP may be made of a photoresist 101 capable of lithography.

Specifically, the probe head 1 according to the exemplary embodiment of the present disclosure may include the guide plate GP made of the photoresist 101 capable of lithography. In this case, the guide plate GP constituting the probe head 1 according to the exemplary embodiment of the present disclosure may include the upper guide plate 40, the lower guide plate 50, and the intermediate guide plate 60. Therefore, in the case of the probe head 1 according to the exemplary embodiment of the present disclosure, at least one of the upper guide plate 40, the lower guide plate 50, and the intermediate guide plate 60 may be made of the photoresist 101 capable of lithography. For example, the photoresist 101 capable of lithography may be an epoxy, polyimide (PI), or acrylate-based photoresist. As a more specific example, the photoresist 101 capable of lithography may be SU-8, which is an epoxy-based resist in which eight epoxy groups are included in a single molecule.

When at least one of the upper guide plate 40, the lower guide plate 50, and the intermediate guide plate 60 is provided at the probe head 1 according to the exemplary embodiment of the present disclosure, the guide plates 40, 50, and 60 may be made of different materials including the photoresist 101 capable of lithography.

In addition, when at least one of the upper guide plate 40, the lower guide plate 50, and the intermediate guide plate 60 is provided at the probe head 1 according to the exemplary embodiment of the present disclosure, at least one thereof may be made of the photoresist 101 capable of lithography.

As an example, the upper and lower guide plates 40 and 50 may be made of the photoresist 101 capable of lithography, and the intermediate guide plate 60 may be made of a different material. For example, the different material may include an anodic aluminum oxide film.

Hereinafter, as an example, it will be described that the upper guide plate 40, the lower guide plate 50, and the intermediate guide plate 60 are made of the photoresist 101 capable of lithography.

The photoresist 101 capable of lithography has an excellent light-transmitting property and enables easy formation of the guide hole GH.

Specifically, in the photoresist 101, the guide hole GH may be formed by lithography. The process of forming the guide hole GH in the photoresist 101 by lithography is as follows.

As an example, the photoresist 101 may be provided in the form of a film or a roll. Then, a masking material layer in which a patterning region is formed may be provided on the photoresist 101. Then, light may be irradiated onto the photoresist 101 through the patterning region of the masking material layer. In the photoresist 101, a region having an area corresponding to that of the patterning region may be exposed by the light irradiation. Then, a remaining region not exposed to the light irradiation may be dissolved and removed by means of a developing solution, and the region exposed by the light irradiation may not be dissolved. As a result of dissolving and removing the remaining region, a through-hole H may be formed in the photoresist 101. The through-hole H of the photoresist 101 may be the guide hole GH of the guide plate GP made of the photoresist 101.

In the photoresist 101, a plurality of through-holes H may be simultaneously formed through the above process.

In addition, in the photoresist 101, the through-holes H may be formed in a fine size and pitch since the through-holes H are formed using the developing solution. When the through-holes H are formed by a dry etching process, inner walls thereof may be formed vertically.

After the formation of the through-holes H, the photoresist 101 may be subjected to a heat treatment process. In an experiment for comparing the hardness of the photoresist 101 before and after heat treatment, the results showed that the hardness was changed after heat treatment.

In the above experiment, a first photoresist film and a second photoresist film were used as specimens.

In the above experiment, the first photoresist film was provided with a thickness of 100 μm, the second photoresist film was provided with a thickness of 50 μm, and the heat treatment process was performed at a temperature of 150° C. for 150 minutes.

[Table 1] illustrates a change in hardness before and after heat treatment for the first photoresist film and the second photoresist film each subjected to the heat treatment process in the same temperature environment (specifically, 150° C.) and heat treatment time (specifically, 150 minutes).

TABLE 1

| Vickers hardness (HV) | First photoresist film | | Second photoresist film | |
| --- | --- | --- | --- | --- |
| | Before heat treatment | After heat treatment | Before heat treatment | After heat treatment |
| HV | 0.75 | 44.417 | 19.381 | 25.261 |

As illustrated in [Table 1], the hardness (HV) of the first photoresist film before heat treatment is 0.75, and the hardness of the first photoresist film after heat treatment is 44.417. The first photoresist film exhibited an increase in the hardness after heat treatment by 43.667 compared to the hardness before heat treatment.

As illustrated in [Table 1], the hardness of the second photoresist film before heat treatment is 19.381, and the hardness of the second photoresist film after heat treatment is 25.261. The second photoresist film exhibited an increase in the hardness after heat treatment by 5.88 compared to the hardness before heat treatment.

Referring to [Table 1], in the case of the first photoresist film with a thicker thickness than the second photoresist film, the increase in the hardness after heat treatment compared to the hardness before heat treatment was larger than that of the second photoresist film.

However, from the results of the change in the hardness before and after heat treatment of the second photoresist film, it is revealed that even if the photoresist 101 is provided in the form of a thin film having a relatively thinner thickness, the hardness may be improved if the heat treatment process is performed.

According to the experimental results referring to [Table 1], the photoresist 101 may be subjected to the heat treatment process regardless of the thickness of the photoresist 101, so that the hardness after heat treatment may be increased compared to before heat treatment, resulting in excellent hardness.

Therefore, in the case of the probe head 1 according to the exemplary embodiment of the present disclosure, the photoresist 101 forming the guide plate GP may be heat-treated to have a higher hardness than before being heat-treated.

Since the guide plate GP is made of the photoresist 101 having excellent hardness, it is possible to prevent particle generation that may occur in an opening of the guide hole GH when the probe 80 is inserted. Specifically, the probe 80 may be provided in the probe head 1 according to the exemplary embodiment of the present disclosure by inserting the sharp front end of the probe 80 through the opening of the guide hole GH of the guide plate GP. In the process of inserting the probe 80, particles may be generated due to friction between the sharp front end of the probe 80 and an inner wall of the opening of the guide hole GH. When the particles generated from the inner wall of the opening of the guide hole GH are introduced into the guide plate GP, the overall performance of the probe head may be deteriorated.

However, since the probe head 1 according to the exemplary embodiment of the present disclosure includes the guide plate GP made of the photoresist 101 having improved hardness, excellent hardness may be achieved. With this, the inner wall of the opening of the guide hole GH may have abrasion resistance. As a result, it is possible to prevent the problem in which the particles are generated due to friction between the inner wall of the opening of the guide hole GH and the front end of the probe 80 during the insertion of the probe 80 into the guide hole GH.

The guide plate GP of the probe head 1 according to the exemplary embodiment of the present disclosure may have a light-transmitting property. The guide plate GP may retain the light-transmitting property possessed by the photoresist 101 forming the guide plate GP.

In the case of the photoresist 101, as a result of conducting an experiment for measuring light transmittance before and after heat treatment, it was confirmed that the light-transmitting property was maintained even if the heat treatment process was performed. In the above experiment, one first photoresist film was provided with a thickness of 100 μm and one second photoresist film was provided with a thickness of 50 μm. [Table 2] below is a table illustrating a comparison in visible light transmittance before and after heat treatment between the first photoresist film and the second photoresist film.

TABLE 2

| | | | Transmittance (%) | | | |
| | | | First photoresist film | | Second photoresist film | |
| | Color | Wavelength range (nm) | Before heat treatment | After heat treatment | Before heat treatment | After heat treatment |
| --- | --- | --- | --- | --- | --- | --- |
| Visible light (VIS) | Red | 620~780 | 90.1 | 87.2 | 90.5 | 90.4 |
| | Orange | 590~620 | 89.9 | 82.8 | 90.3 | 90.1 |
| | Yellow | 570~590 | 89.9 | 80.8 | 90.3 | 89.9 |
| | Green | 495~570 | 89.6 | 70.5 | 90.1 | 89.5 |
| | Blue | 450~495 | 89.1 | 17.0 | 89.9 | 88.6 |
| | Purple | 380~450 | 85.8 | 23.3 | 89.1 | 84.9 |

The first photoresist film and the second photoresist film exhibited transmittance as illustrated in [Table 2] when visible light in the same wavelength range was irradiated before and after heat treatment. In the experiment, the first photoresist film and the second photoresist film were irradiated with visible light of six colors according to the wavelength range.

As illustrated in [Table 2], when the first photoresist film was irradiated with red visible light in the wavelength range of 620 to 780 nm, the transmittance before heat treatment was 90.1%, and the transmittance after heat treatment was 87.2%. In the case of the first photoresist film, the transmittance was slightly decreased after heat treatment compared to before heat treatment, but the transmittance after heat treatment was maintained almost at the same level as that before heat treatment.

On the other hand, when the first photoresist film was irradiated with orange visible light in the wavelength range of 590 to 620 nm, the transmittance before heat treatment was 89.9%, and the transmittance after heat treatment was 82.8%.

As illustrated in [Table 2], in the case of the second photoresist film, the transmittance was maintained constant before and after heat treatment for all the six types of visible light.

On the other hand, as illustrated in [Table 2], in the case of the first photoresist film, there was a large difference in the transmittances before and after heat treatment depending on the color of visible light, but the transmittance was maintained constant before and after heat treatment for most of the six types of visible light. As confirmed from the experimental results using the first photoresist film, the transmittance of the photoresist 101 may be adjusted according to the type of the photoresist 101 and heat treatment conditions. Therefore, the photoresist 101 may provide a degree of opacity in a specific light region.

According to the above experimental results, the probe head 1 according to the exemplary embodiment of the present disclosure may have a light-transmitting property even if the guide plate GP is formed using the heat-treated photoresist 101.

Since the guide plate GP provided at the probe head 1 according to the exemplary embodiment of the present disclosure has a light-transmitting property, it is possible to advantageously insert the probe 80.

Specifically, the probe 80 may be inserted into the upper guide hole 43 of the upper guide plate 40, then inserted into the intermediate guide hole 63 of the intermediate guide plate 60, and finally inserted into the lower guide hole 53 of the lower guide plate 50 to protrude outward. As such, the probe 80 may be provided in the probe head 1 according to the exemplary embodiment of the present disclosure by sequentially passing through the upper guide hole 43, the intermediate guide hole 63, and the lower guide hole 53. In this case, due to the light-transmitting property of the upper guide hole 43, the intermediate guide hole 63, and the lower guide hole 53, the positions of the upper guide hole 43, the intermediate guide hole 63, and the lower guide hole 53 may be accurately identified with the naked eye. This may facilitate the sequential insertion of the probe 80 from the upper guide hole 43 into which the front end of the probe 80 is inserted to the intermediate guide hole 63 and the lower guide hole 53 positioned corresponding thereto.

As illustrated in FIGS. 2 and 3, a reinforcing plate RP coupled to the guide plate GP may be further provided in the seating region SF. The reinforcing plate RP may be optionally provided and coupled to at least a surface of the guide plate GP. Hereinafter, it will be described that the reinforcing plate RP is provided on the at least a surface of the guide plate GP of the probe head 1 according to the exemplary embodiment of the present disclosure.

The reinforcing plate RP may be coupled to the at least a surface of the guide plate GP. In this case, the reinforcing plate RP may include an upper reinforcing plate 710 coupled to a surface of the upper guide plate 40, a lower reinforcing plate 720 coupled to a surface of the lower guide plate 50, and an intermediate reinforcing plate 730 coupled to a surface of the intermediate guide plate 60.

Therefore, the upper guide plate 40 may include an upper guide pin insertion hole 41 into which a guide pin is inserted to align the upper guide plate 40 with the upper reinforcing plate 710 provided on the surface of the upper guide plate 40. In addition, the upper guide plate 40 may include an upper main bolt fastening hole 42 into which a coupling means for coupling the upper reinforcing plate 710 and the first plate 10 is inserted.

The reinforcing plate RP may include a recess hole RH in which the probe 80 inserted through the guide hole GH is positioned. In this case, the upper reinforcing plate 710 provided on the surface of the upper guide plate 40 may include an upper recess hole 711, the lower reinforcing plate 720 provided on the surface of the lower guide plate 50 may include a lower recess hole 721, and the intermediate reinforcing plate 730 provided on the surface of the intermediate guide plate 60 may include an intermediate recess hole 731.

The recess hole RH may be formed in a shape having a quadrangular cross-section as an example, but the shape thereof is not limited thereto. Therefore, a shape having a circular cross-section may be possible.

The recess hole RH may have an area larger than that of a guide hole presence region defined by a plurality of guide holes GH formed in each of the upper guide plate 40, the lower guide plate 50, and the intermediate guide plate 60, so as to allow the plurality of probes 80 to be positioned therein.

Since each of the upper guide plate 40, the lower guide plate 50, and the intermediate guide plate 60 is provided with the reinforcing plate RP having the recess hole RH, opposite ends of the surface of each of the guide plates 40, 50, and 60 may be supported by the reinforcing plate RP.

Since the lower guide plate 50 and the intermediate guide plate 60 have a shape corresponding to the upper guide plate 40, each of the lower guide plate 50 and the intermediate guide plate 60 may include a guide pin insertion hole and a main bolt fastening hole that are the same in function, shape, and position as those of the upper guide plate 40.

The reinforcing plate RP may serve to support the upper guide plate 40, the lower guide plate 50, and the intermediate guide plate 60, and thus may be made of a material having high mechanical strength. Specifically, for example, the reinforcing plate RP may be made of a Si3N4 material. In another example, the reinforcing plate RP may be made of a ceramic material, but is not limited thereto.

The reinforcing plate RP, the upper guide plate 40, the lower guide plate 50, and the intermediate guide plate 60 may be coupled to each other by bonding or molding.

With such a structure, the guide plate GP may have an advantage in terms of mechanical strength while implementing a fine size and pitch of a plurality of upper guide holes 43, a plurality of lower guide holes 53, and a plurality of intermediate guide holes 63.

The guide plate GP made of the photoresist 101 as described above may be more efficient in forming the upper guide holes 43, the lower guide holes 53, and the intermediate guide holes 63 vertically. In addition, the photoresist 101 may be suitable for implementing the fine size and pitch of the through-holes H. In the case of the probe head 1 according to the exemplary embodiment of the present disclosure, by forming a structure in which at least one of the upper guide plate 40, the lower guide plate 50, and the intermediate guide plate 60 made of the photoresist 101 is provided, and the reinforcing plate RP is coupled to the surface of the at least one of the guide plates 40, 50, and 60, it is possible to arrange the probes 80 of a fine size with a fine pitch. At the same time, the probe head 1 according to the present disclosure may have excellent durability in which warpage deformation is prevented.

Figure 4A:
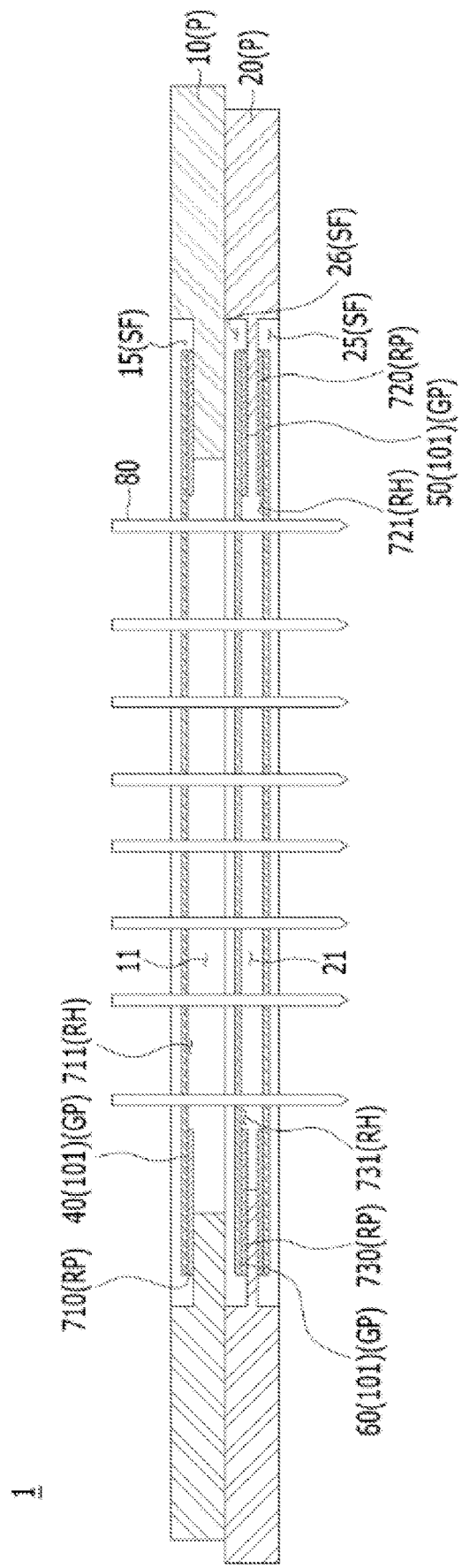
FIGS. 4a and 4b illustrates the probe head illustrated in FIG. 1.

FIG. 4 illustrates the probe head 1 according to the exemplary embodiment of the present disclosure illustrated in FIG. 1. Specifically, FIG. 4(*a*) is a view illustrating the probes 80 before undergoing elastic deformation, and FIG. 4(*b*) is a view illustrating the probes 80 after undergoing elastic deformation.

Referring to FIG. 4(*a*), the probes 80 may vertically pass through the upper guide plate 40, the intermediate guide plate 60, and the lower guide plate 50. In this case, the probes 80 may be in a vertical state in which elastic deformation.

Specifically, each of the probes 80 may be inserted into each of the upper guide holes 43 of the upper guide plate 40, then inserted into each of the intermediate guide holes 63 of the intermediate guide plate 60, and finally inserted into each of the lower guide holes 53 of the lower guide plate 50 to protrude outward. Therefore, the front end of the probe 80 may protrude from the second plate 20.

Each of the upper guide plate 40, the lower guide plate 50, and the intermediate guide plate 60 may have visibility due to the light transmittance of the photoresist 101. Therefore, the probe head 1 according to the exemplary embodiment of the present disclosure may have an advantage of facilitating the insertion of the probe 80.

Specifically, the probe 80 may sequentially pass through the upper guide plate 40, the intermediate guide plate 60, and the lower guide plate 50. In this case, due to the light-transmitting property of the guide plate GP, the positions of the intermediate guide hole 63 and the lower guide hole 53 positioned corresponding to the upper guide hole 43 may be accurately identified with the naked eye. In addition, a lighting device may be provided to further secure visibility. Therefore, in the case of the probe head 1 according to the exemplary embodiment of the present disclosure, the insertion of the probe 80 may be rapidly performed.

After the probe 80 sequentially passes through the upper guide plate 40, the intermediate guide plate 60, and the lower guide plate 50, the first plate 10 may be horizontally relatively moved.

As illustrated in FIG. 4(*a*), when the first and second plates 10 are aligned, the upper guide plate 40, the lower guide plate 50, and the intermediate guide plate 60 may be located on the same vertical line. Therefore, the upper guide hole 43, the lower guide hole 53, and the intermediate guide hole 63 may be located on the same vertical line, and the probe 80 may vertically pass through the upper guide hole 43, the intermediate guide hole 63, and the lower guide hole 53.

When the insertion of the probe 80 is completed, as illustrated in FIG. 4(*b*), the first plate 10 may be moved horizontally (in the direction of the arrow). In this case, the first plate 10 may be moved after the guide pin is removed.

Figure 4B:
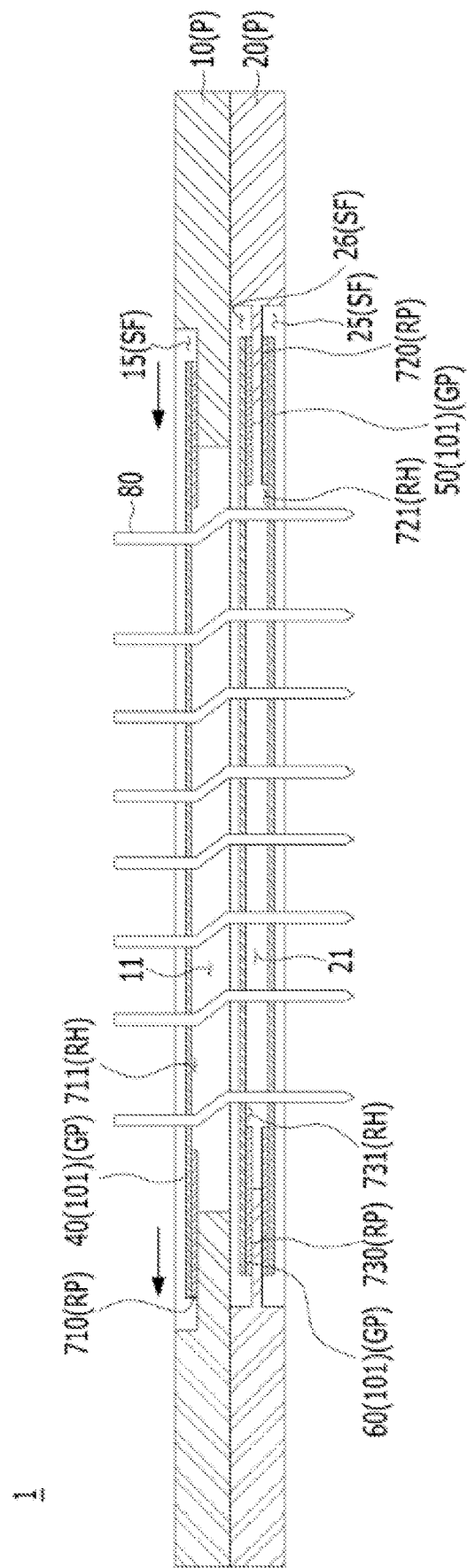

When the first plate 10 is moved to one side, the position of the upper guide hole 43 may be changed, and the probe 80 may be elastically deformed according to the positional movement of the upper guide hole 43. Specifically, an upper portion of the probe 80 may be deformed in the moving direction of the first plate 10, and an intermediate portion of the probe 80 and a lower portion of the probe 80 including the first end, which pass through the intermediate guide hole 63 and the lower guide hole 53, may be maintained in a vertical state. Therefore, when the first plate 10 is moved, as illustrated in FIG. 4(b), an elastically deformed structure of the probe 80 may be implemented.

In the case of the probe head 1 according to the preferred embodiment of the present disclosure, although it has been described that the first plate 10 is moved in one direction, an elastically deformed structure of the probe 80 in which the second plate 20 is moved in one direction may be implemented.

Figure 5:
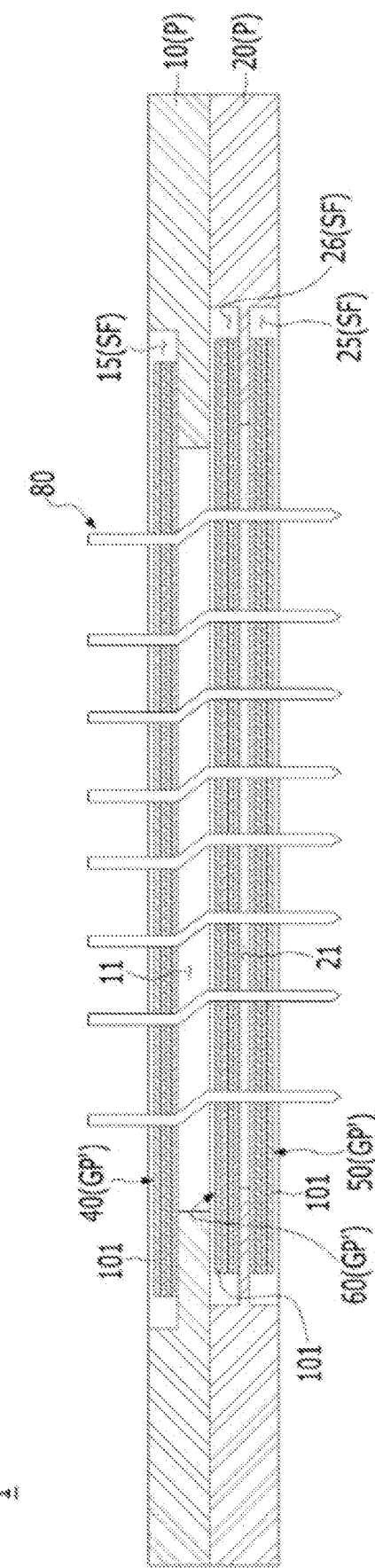
FIG. 5 is a view illustrating a modified example of a guide plate constituting the probe head according to the exemplary embodiment of the present disclosure.

FIG. 5 is a view schematically illustrating a modified example of the guide plate GP constituting the probe head according to the exemplary embodiment of the present disclosure. In the modified example, a guide plate GP' is different from the guide plate GP of the probe head 1 according to the exemplary embodiment of the present disclosure in that it is provided by stacking a photoresist 101 capable of lithography.

As illustrated in FIG. 5, at least one of an upper guide plate 40, a lower guide plate 50, and an intermediate guide plate 60 constituting the guide plate GP' may be provided by stacking the photoresist 101 capable of lithography. In the modified example of the guide plate GP of the probe head 1 according to the exemplary embodiment of the present disclosure, each of the upper guide plate 40, the lower guide plate 50, and the intermediate guide plate 60 may be formed by stacking the photoresist 101 capable of lithography.

The photoresist 101 may have a thickness in the range of tens of μm to hundreds of μm, and preferably, a plurality of photoresists 101 each having a thickness in the range of 20 μm to 500 μm may be stacked.

Alternatively, the photoresist 101 may have a thickness in the range of several μm to several tens of μm, and preferably, a plurality of photoresists 101 each having a thickness in the range of 5 μm to 75 μm may be stacked.

As illustrated in FIG. 5, the upper guide plate 40 formed by stacking the plurality of photoresists 101 may be provided in an upper seating region 15 of a first plate 10. A second plate 20 may be coupled to a lower portion of the first plate 10. An intermediate guide plate 60 formed by stacking the plurality of photoresists 101 may be provided in an intermediate seating region 26 of the second plate 20, and a lower guide plate 50 formed by stacking the plurality of photoresists 101 may be provided in a lower seating region 25.

In the upper guide plate 40, the lower guide plate 50, and the intermediate guide plate 60 each of which is formed by stacking the plurality of photoresists 101, a plurality of upper guide holes 43, a plurality of lower guide holes 53, and a plurality of intermediate guide holes 63 into which a plurality of probes 80 are inserted may be simultaneously formed, respectively. The guide holes 43, 53, and 63 may be formed by removing regions not exposed to light irradiation by means of a developing solution in a lithography process. With this, more efficient manufacturing is possible in terms of manufacturing the upper guide plate 40, the lower guide plate 50, and the intermediate guide plate 60.

Since each of the upper guide plate 40, the lower guide plate 50, and the intermediate guide plate 60 is formed by stacking the plurality of photoresists 101 having excellent hardness due to heat treatment, high mechanical strength may be achieved. Therefore, the guide plate GP having a structure in which the plurality of photoresists 101 are stacked has an advantage of having excellent mechanical strength and enabling efficient formation of a plurality of guide holes GH.

The process of inserting the probes 80 into the guide plate GP' of the modified example may be same as that of inserting the probes 80 into the guide plate GP of the probe head 1 according to the exemplary embodiment of the present disclosure.

Specifically, each of the probes 80 may be inserted into each of the upper guide holes 43 located at vertically corresponding positions, then inserted into each of the intermediate guide holes 63 located at vertically corresponding positions, and finally inserted into each of the lower guide holes 53 located at located vertically corresponding positions to protrude outward.

When the plurality of photoresists 101 are stacked, light transmittance may be reduced compared to the case where one photoresist 101 is used, but the light-transmitting property of the photoresists 101 may be maintained and thus a certain level of light transmittance may be achieved. Therefore, the process of inserting the probe 80 may be performed without difficulty.

Then, at least one of the first plate 10 and the second plate 20 may be moved so that the probe 80 is elastically deformed.

In the case of the guide plate GP' of the modified example formed by stacking the plurality of photoresists 101, a reinforcing plate RP may be provided on at least a surface of the upper guide plate 40, the lower guide plate 50, and the intermediate guide plate 60.

In this case, the reinforcing plate RP may be positioned between the plurality of photoresists 101 or provided on at least a surface of a stacked structure formed by the plurality of photoresists 101. The reinforcing plate RP may be provided in a structure in which a recess hole RH is formed.

When the reinforcing plate RP is provided between the plurality of photoresists 101, the reinforcing plate RP may increase mechanical strength by supporting the plurality of photoresists 101 on upper and lower surfaces thereof.

On the other hand, when the reinforcing plate RP is provided on at least a surface of the stacked structure formed by the plurality of photoresists 101, the reinforcing plate RP may increase mechanical strength by supporting the plurality of photoresists 101 on the upper surface or the lower surface thereof.

The plurality of photoresists 101 may be bonded together by thermocompression bonding to form the guide plate GP' having a stacked structure.

In other words, the photoresists 101 may have a photosensitivity property capable of lithography and a bonding property. With this, the photoresists 101 may be bonded together through thermocompression bonding without requiring provision of a separate bonding layer between the photoresists 101.

In FIG. 5, as an example, four photoresists 101 are illustrated as being stacked to form the guide plate GP', but the number of the stacked photoresists 101 is not limited thereto.

Specifically, the number of the photoresists 101 constituting each of the upper guide plate 40, the lower guide plate 50, and the intermediate guide plate 60 may be different or the same.

In FIG. 5, each of the upper guide plate 40, the lower guide plate 50, and the intermediate guide plate 60 is illustrated as being formed by stacking the four photoresists 101.

Alternatively, any one of the upper guide plate 40, the lower guide plate 50, and the intermediate guide plate 60 may be formed by one photoresist 101 and the reinforcing plate RP provided on a surface of the photoresist 101, and the remaining two may be formed by the plurality of photoresists 101 or by the plurality of photoresists 101 and the reinforcing plate RP provided between or on a surface of the plurality of photoresists 101.

Alternatively, two of the upper guide plate 40, the lower guide plate 50, and the intermediate guide plate 60 may be formed by the plurality of photoresists 101 or by the plurality of photoresists 101 and the reinforcing plate RP provided between or on a surface of the plurality of photoresists 101, and the remaining one may be formed by one photoresist 101 and the reinforcing plate RP provided on a surface of the photoresist 101.

According to the probe head 1 according to the exemplary embodiment of the present disclosure, it is possible to implement a fine size and pitch of holes into which the probes 80 are inserted by forming the guide plate GP, which serves to guide the front ends of the probes 80, with the photoresist 101 capable of lithography, and to increase efficiency of the manufacturing process by forming the holes into which the probes 80 are inserted simultaneously and rapidly.

In addition, according to the probe head 1 according to the exemplary embodiment of the present disclosure, it is possible to facilitate the insertion of the probes 80 by forming the guide plate GP with the photoresist 101 having a light-transmitting property. In this case, the photoresist 101 may have excellent hardness due to the heat treatment process. Therefore, the probe head 1 according to the exemplary embodiment of the present disclosure may achieve high mechanical strength and enable easy insertion of the probes 80.

In addition, according to the probe head 1 according to the exemplary embodiment of the present disclosure, it is possible to implement a structure that is easy to handle by forming the guide plate GP to have an area smaller than that of each of the first and second plates 10 and 20 supporting the guide plate GP.

As described above, the present disclosure has been described with reference to the exemplary embodiment. However, those skilled in the art will appreciate that various modifications, additions, and substitutions are possible, without departing from the scope and spirit of the present disclosure as disclosed in the accompanying claims.

DESCRIPTION OF THE REFERENCE NUMERALS IN THE DRAWINGS

100: probe card
101: photoresist
1: probe head
GP: guide plate
40: upper guide plate 50: lower guide plate
60: intermediate guide plate

The invention claimed is:

1. A probe head for guiding a probe, the probe head comprising:
   a guide plate that has a guide hole into which the probe is inserted and is made of a photoresist capable of lithography,
   wherein the photoresist has a light-transmitting property, and
   wherein the photoresist is subjected to heat treatment, so that the heat-treated photoresist has a hardness increased compared to before the heat treatment.

2. The probe head of claim 1, wherein the photoresist of the guide plate is an epoxy, polyimide, or acrylate-based photoresist.

3. The probe head of claim 1, wherein the guide plate is provided by stacking a plurality of photoresists capable of lithography.

4. A probe card comprising:
   a space transformer comprising a probe connection pad electrically connected to each of a plurality of probes; and
   a probe head provided below the space transformer,
   wherein the probe head comprises a guide plate made of a photoresist capable of lithography,
   wherein the photoresist has a light-transmitting property, and
   wherein the photoresist is subjected to heat treatment, so that the heat-treated photoresist has a hardness increased compared to before the heat treatment.

* * * * *